United States Patent [19]

Nishizawa et al.

[11] 4,340,827
[45] Jul. 20, 1982

[54] SEMICONDUCTOR INTEGRATED CIRCUIT

[75] Inventors: Jun-ichi Nishizawa, Sendai; Yutaka Hayashi, Hoya, both of Japan

[73] Assignees: Zaidan Hojin Handotai Kenkyu Shinkokai, Sendai; Agency of Industrial Science and Technology, Tokyo, both of Japan

[21] Appl. No.: 39,437

[22] Filed: May 15, 1979

[30] Foreign Application Priority Data

May 16, 1978 [JP] Japan .................................. 53-57184

[51] Int. Cl.³ .................... H03K 19/091; H01L 27/04
[52] U.S. Cl. ................................ 307/477; 307/317 A; 357/43; 357/92
[58] Field of Search ........... 307/213, 214, 215, 317 A, 307/459, 477; 357/15, 92, 43

[56] References Cited

U.S. PATENT DOCUMENTS

| | | | |
|---|---|---|---|
| 3,699,362 | 10/1972 | Jordan | 307/317 A X |
| 4,009,397 | 2/1977 | Mulder et al. | 307/214 X |
| 4,064,405 | 12/1977 | Cricchi et al. | 307/214 X |
| 4,115,793 | 9/1978 | Nishizawa | 357/22 |
| 4,121,116 | 10/1978 | Ngutung | 307/213 |
| 4,160,918 | 7/1979 | Nazarian et al. | 307/477 |
| 4,198,648 | 4/1980 | Nishizawa | 357/43 |
| 4,243,895 | 1/1981 | Nazarian et al. | 307/477 |

FOREIGN PATENT DOCUMENTS

53-100783  9/1978  Japan .
1482952  8/1977  United Kingdom .................. 357/92

Primary Examiner—Eugene R. La Roche
Attorney, Agent, or Firm—Cushman, Darby & Cushman

[57] ABSTRACT

A Schottky diode is connected between the collector and the base of a common-base bipolar transistor to form a by-pass of the output current. The output current of this composite three-terminal structure becomes rapidly low when the voltage across the transistor is reduced below a threshold value. This three-terminal structure can be formed in a simple integrated structure and is particularly suited for driving a unipolar transistor of high input impedance, e.g. for use as the injector of an integrated injection logic. The bipolar transistor may also be substituted by a field effect transistor to constitute a three-terminal structure of similar characteristics.

23 Claims, 11 Drawing Figures

SEMICONDUCTOR INTEGRATED CIRCUIT

BACKGROUND OF THE INVENTION (a) Field of the Invention

The present invention concerns a semiconductor circuit device which is operated with low power dissipation and at a high speed, and more particularly it pertains to a semiconductor circuit device including an injector transistor for supplying a current and an inverter transistor for performing a switching action by a current supplied from the injector transistor.

(b) Description of the Prior Art

Integrated injection logic (referred to as IIL, hereinafter), has attracted attention ever since it has been proposed, because of the features of high speed operation and low power dissipation. An IIL circuit, fundamentally, comprises a plurality of inverter stages, each comprising an injector transistor for supplying a constant current and an inverter transistor having a control electrode means whose potential is controlled by the current supplied from the injector transistor. The output terminal of one stage is connected to the control electrode of the inverter transistor of the succeeding stage. The current supplied by an injector transistor constitutes a controlling current for the inverter transistor of the same stage, or alternatively it can constitute a main current of the inverter transistor of the preceding stage. Namely, a logic (inverter) operation is carried out by the switching-over action so that the flow of the injection current to the inverter transistor of the preceding stage is switched over to the inverter transistor of said same stage, and vice versa (between the main current of the inverter of the preceding stage and the control current of the inverter of the same stage). Thus, an IIL features the performance of switch-over between the constant-current recipient circuits, and the product of power dissipation and signal transfer delay time is advantageously small.

However, it is usual in an inverter transistor that the level of its main current is different from the level of its control current. The main current is usually much larger than the control current. A large control current enables the inverter transistor to effect a quick switching action. When the inverter transistor is turned on, however, the supply of the constant injection current will cause the problem of an excess injection. Such excess injection will cause the storage of minority carriers in the semiconductor region held at the ground potential, and will constitute a factor of limiting the operation speed.

The IIL circuit was first proposed as an improved bipolar logic. Improved IIL type logic circuit utilizing unipolar transistors have also been proposed. The unipolar transistor includes static induction transistor (hereinafter referred to as SIT) and field effect transistor (hereinafter referred to as FET), both of which may be of the junction-gate type or the insulated-gate type. The difference between the control current level and the main current level in a unipolar transistor is much greater than that noted in a bipolar transistor. Therefore, when an injector transistor supplies a current to a control electrode of a turned-on junction-gate type unipolar transistor of the same stage, an excessive charge carriers are forcibly injected from the control electrode into the semiconductor region connected to the reference voltage. Accordingly, the effect of the injected minority carriers is too great to be permissible and is one of the primary factors limiting the maximum operation speed.

Description will be made, hereinbelow, mainly on IIL-type semiconductor circuit devices employing unipolar transistors, and particularly on those employing SIT's to serve as the inverter transistors.

A static induction transistor is a unipolar transistor proposed by one (Nishizawa) of the present inventors, and has a very short channel length and a very low impurity concentration in the channel region. The channel region is easily depleted by the gate potential due to the very low impurity concentration. A potential barrier can be established in the depleted channel region and can be controlled by both of the gate potential and the drain potential. The very short channel length makes the current versus voltage characteristic unsaturating and makes the gate capacitance very small. The non-saturating characteristic provides for a low output impedance. In such an SIT potential distribution in the channel region has a focusing effect on the travelling majority carriers, and the negative temperature dependency of carrier mobility serves to prevent the thermal run-aways. Current control is achieved not by the control current but by the control of the potential barrier established in the channel, and a high input impedance is derived.

Figure 1A:
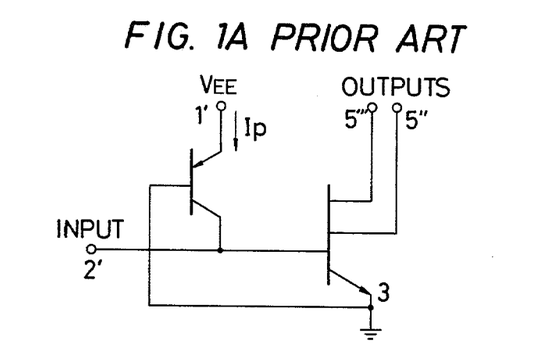
FIGS. 1A and 1B are a circuit diagram and correlated plan and cross-sectional views of an example of the basic structure of a known IIL type SIT integrated circuit.
Figure 1B:
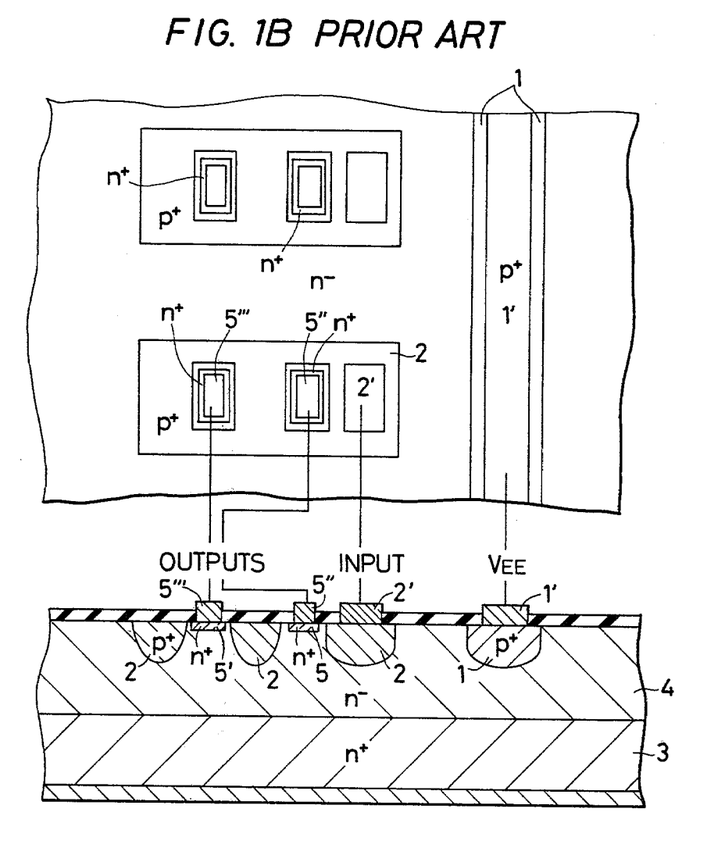

The SIT which has a high input impedance and allows direct coupling to a subsequent stage and hardly requires a driving power, and has a small power dissipation, and exhibits a non-saturating type current versus voltage characteristic and has a large transconductance and allows a large number of fan-out to be taken out, and operates at a high speed, is very suitable for being used in integrated circuits. A static induction transistor integrated circuit, which is constructed in the form of a circuit equivalent to an IIL, containing an upside-down type SIT has been proposed by one of the inventors of the present application in, for example, U.S. Ser. Nos. 748,292 and 819,343. An equivalent circuit of the basic circuitry of such SIT-IC is as shown in FIG. 1A. An example of the structure of such SIT-IC is as shown in FIG. 1B. The device shown in these Figures represents an instance of one input and two outputs.

In FIG. 1B, $p^+$ type regions 1 and 2 represent an emitter region and a collector region, respectively, of a lateral bipolar transistor which operates as an injector. The $p^+$ type region 2 concurrently serves as a gate region of an upside-down type SIT. Numeral 3 represents a source region of this SIT, and is formed either of an $n^+$ type substrate or of an $n^+$ type embedded region. Shallow $n^+$ type regions 5 and 5' represent drains of said SIT.

An $n^-$ type continuous region partly forms a base region of the lateral bipolar transistor and partly forms a channel region of the SIT. The gate-to-gate distance or the channel width of this SIT is so selected that the channel is sufficiently pinched off by the depletion layer when no bias voltage is applied to the gate (input terminal). The lateral bipolar transistor may have a totally depleted base region to form a punching-through bipolar transistor, but preferably has a saturated characteristic. Prevention of punching-through can be achieved by separating the emitter-to-collector distance, or by increasing the impurity concentration of the base region by selective diffusion or implantation.

By the use of four masking and by relying on a standard process of diffusion technique, a power.delay product of 0.002 pJ in the low current region and a minimum delay time of 4-5 nsec at a power dissipation of about 100 μW can be obtained. The minimum delay time of an SIT-IC which is manufactured by relying on a standard manufacturing process gives a value surpassing those values exhibited by VIL (Vertical Injection Logic) and SSL (Self-Aligned Super Injection Logic) which represent modified IIL. From the fact that the power.delay product is 0.07 pJ in VIL and 0.06 pJ in SSL, the power.delay product of 0.002 pJ exhibited by said SIT-IC from the standard process is noted to be as small as 1/30 or even lower than that of VIL and SSL. Such excellent abilities as shown above are attributable to the facts such as: that the current amplification factor (emitter efficiency) of the lateral bipolar transistor can be made relatively large; that the gate capacitance can be made small without increasing the gate resistance; and that the SIT has the function of focusing the carrier currents also in an upside-down type structure whose drain region has an area smaller than that of the source region, leading to a large transconductance. The factor which has limited to the operation speed of known SIT-IC is the storage effect of the excessive minority carriers injected from the gate region of an SIT which operates as an inverter into the channel region and to that surface of the substrate located on the outside of the gate region. Since an SIT, fundamentally, is a voltage controlled device, it can be turned to the conducting state even without the presence of injection of carriers from its gate region. Needless to say, an appropriate amount of minority carrier injection from the gate region can urge the injection of majority carriers from the source region to thereby minimize the resistance value of the transistor during its conducting state, allowing a large current to flow even if the channel has a small area, resulting in an improvement in the switching speed thereof. If, however, an excessive amount of minority carriers is injected, the storage effect of minority carriers around the gate region due to the IC structure using such SIT will contribute to lower the operating speed of such integrated circuit.

The storage of minority carriers within the channel region serves to lower the resistance value of the transistor in its conducting stage, and moreover the amount of minority carriers stored is small, so that an optimum design of transistor is logically possible. It should be noted, however, that in the region located outside the gate region 2 in the plan view of FIG. 1B, and also in the region located between the gate region 2 and the n+ type region 3 in the sectional view of FIG. 1B, an amount of minority carriers is stored which is greater than that stored within the channel region. For this reason, when it is intended to drive an SIT from its conducting state into its cut-off state by another SIT, the above-said large amount of minority carriers which is stored in those regions located outside the channel region should be absorbed away, and therefore the operating speed of the integrated circuit will naturally become markedly lowered. In known IIL, the driver transistor also has been formed with a bipolar transistor, and it has been considered as unavoidable from the viewpoint of operation that a very small amount of storage of minority carriers occur in the regions located outside and below the base region which corresponds to the gate region of an SIT. An excessive amount of minority carriers, however, is preferably avoided. Where the driver transistor is formed with either an SIT or FET, the elimination of this storage of minority carriers, which may be considered as only a secondary phenomenon so to speak, is of the nature of being unharmful when considered from the principles of operation. In other words, the elimination of the minority carrier storage contributes greatly to the enhancement of the speed of operation.

SUMMARY OF THE INVENTION

It is an object of the present invention to provide a semiconductor circuit device which has eliminated the aforesaid drawbacks and inconveniences of the prior art, and which is operated with low power dissipation and at a high speed.

Another object of the present invention is to provide a semiconductor circuit device of current injection type comprising an inverter transistor having a control electrode, an output electrode and a reference voltage electrode, and a Schottky diode connected between the control electrode and the reference voltage electrode.

The Schottky diode provides a by-pass for the injected current. According to the current versus voltage characteristic of the Schottky diode, an injected current is used to raise the potential of the control electrode during the period that the potential of the control electrode is below the threshold voltage of the Schottky diode. In this state, the Schottky diode transmits substantially no current. When the potential of the control electrode is raised up to a value above the threshold value of the Schottky diode, an excessive injection current is by-passed through the Schottky diode to the reference voltage terminal. The threshold value of the Schottky diode is so selected that the inverter transistor is sufficiently turned on into its conducting state before the by-pass Schottky diode is rendered conductive. As is well known, the Schottky diode provides a quick turn-off feature. Therefore, the operation speed of the total semiconductor circuit is greatly enhanced.

DETAILED DESCRIPTION OF THE PREFERRED EMBODIMENTS

In the arrangement of known IIL type SIT-IC which incorporates a lateral bipolar transistor to serve as an injector (load transistor) and also an SIT to serve as a driver (driver transistor) as shown in FIGS. 1A and 1B, the injector operates almost as a constant current source. When a preceding stage is rendered non-conductive (or when an input signal is supplied to the input terminal), the gate potential of the SIT is elevated, and as a result this SIT is switched over to its conducting state. The current which is supplied from the injector will, after having elevated the gate potential up to the level of an operating potential, flow between the gate region and the source region, causing an injection of minority carriers to take place from the gate region into the channel region and into those regions located outside the gate region, and this injection in turn will constitute a storage of excessive minority carriers. In order to design a circuit arrangement which hardly gives rise to an injection of minority carriers from the gate region, the injector transistor may also be formed with an SIT, as proposed by one of the inventors of the present application in, for example, U.S. Ser. No. 867,298 and Japanese Patent Application No. 52-15879. However, where, an SIT is employed as an injector, there is the disadvantage that, as the gate potential of the driver SIT rises, the current of the injector will decrease, so that the charging-up of the gate capacitance of the driver SIT will require some length of time, with the result that the switching speed of the driver SIT is delayed.

Figure 2A:
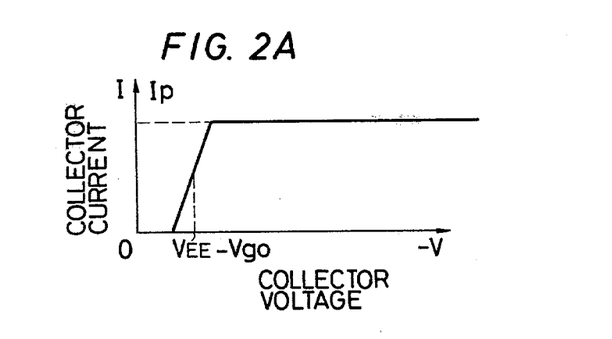
FIGS. 2A through 2E are a desirable current versus voltage characteristic of an injector transistor, a circuit diagram of a composite injector for achieving such desirable characteristic, and a circuit diagram, a cross-sectional view and a plan view of an IIL unit including a bipolar injector transistor and an SIT inverter transistor according to an embodiment of the present invention.

To achieve a sufficiently quick charging-up of the gate capacitance of the driver SIT and yet to achieve inhibition of an injection of excessive minority carriers from the gate region, it would be ideal to employ an injector having such current versus voltage characteristic as shown in FIG. 2A. More particularly, this injector will behave so that it will continuously supply an almost constant current until the gate of the driver SIT reaches a predetermined operating potential $V_{go}$, and then will supply only a very small amount of current after the gate potential has reached the predetermined operating voltage $V_{go}$, a voltage $V_{EE}$-$V_{go}$ being applied across the injector transistor. Such injector will elevate the gate potential up to an operating voltage during an extremely short period of time, and after this level of voltage has been gained, the injector will supply only an amount of current which is necessary to reduce the resistance of the turned-on driver SIT, and will not allow any unnecessary control current to flow. Thus, the power dissipation is small and the operating speed of the device is high. However, an injector having an ideal characteristic as stated above is not available at present.

Figure 2B:
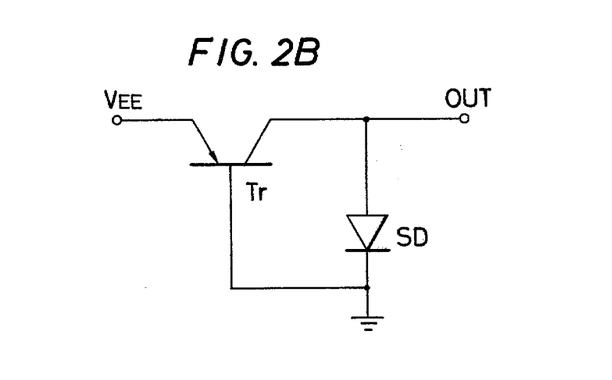

It is, however, possible to provide an operation equivalent to that described above, by means of a composite injector as shown in FIG. 2B. The composite injector of FIG. 2B comprises a parallel connection of an injector transistor and a Schottky diode, the interconnection being the output terminal. In the Figure, a pnp transistor Tr has its emitter connected to a voltage supply $V_{EE}$, its base grounded and its collector forming an output terminal. A Schottky diode SD formed of a Schottky metal deposited on an n type semiconductor is connected between the collector and the ground (base). The Schottky diode is so selected to have an appropriate barrier height that it allows a current to flow when the output terminal gains a potential higher than a predetermined level. When the output terminal is at a low potential (a high voltage being applied across the transistor), the Schottky diode is naturally nonconducting and all the injection current is supplied to the output terminal. When the potential of the output terminal is elevated (a low voltage being applied across the transistor), the Schottky diode is sufficiently forwardly biased to become conductive and provides a by-pass for the injection current. Therefore, the composite injector as described above provides a current versus voltage charateristic as shown in FIG. 2A. Furthermore, since the Schottky diode is almost free of the minority-carrier-storage-effect, it can perform a very quick switching action.

Figure 2C:
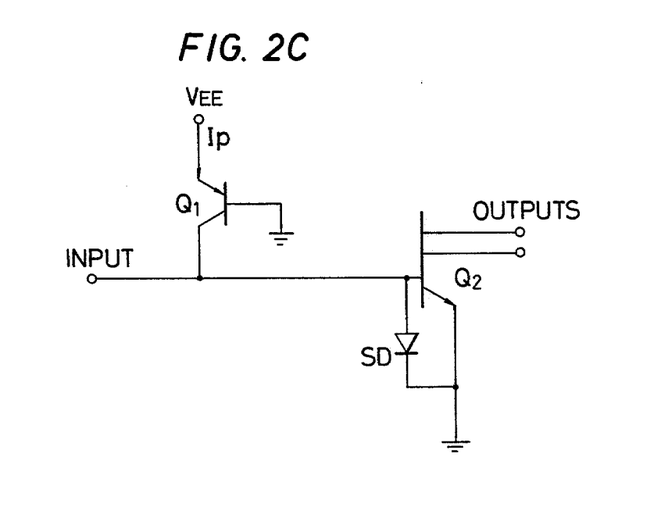

FIG. 2C shows an IIL-type SIT circuit embodying the above-mentioned composite injector. This arrangement has a Schottky diode SD connected between the gate region and the source region of a driver SIT $Q_2$. As such, it will be understood that, as the gate potential of the SIT $Q_2$ rises up to the vicinity of an operating potential, a part of the current which is supplied from an injector transistor $Q_1$ will flow to the Schottky diode SD, so that the injection of excessive minority carriers from the gate region of the driver SIT into the channel region and into the region located outside the gate region will be suppressed. In other words, a drop in the operating speed of the integrated circuit attributable to the storage effect of excessive minority carriers will not occur. The injection of minority carriers will be suppressed only within the range in which the resistance of the SIT is minimized during conduction and the operating speed is enhanced. Thus, the main limiting factor for the operating speed of known SIT-IC's is eliminated, and a logic circuit that is high in operation speed and that requires only a very small dissipation of power is provided.

Figure 2D:
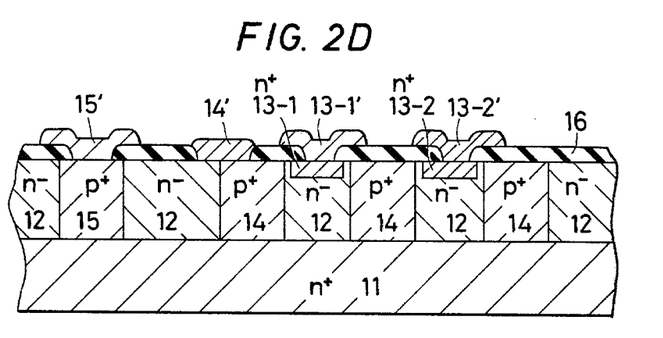
Figure 2E:
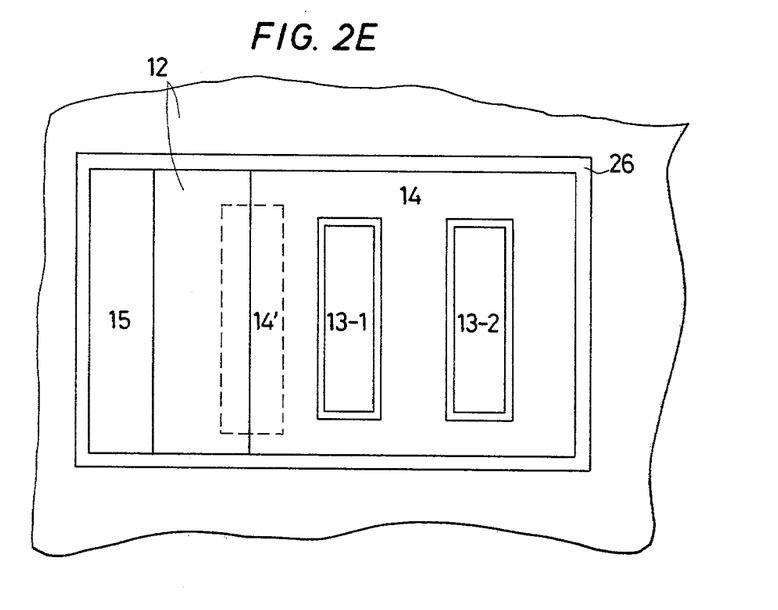

FIGS. 2D and 2E show an exemplary structure materializing the circuit arrangement of FIG. 2C; FIG. 2D shows a sectional view and FIG. 2E shows a plan view. Numeral 16 represents an insulating layer which is made with a substance such as $SiO_2$, $Si_3N_4$ or $Al_2O_3$ and their mixture or a laminated composite insulating layer of a plurality of layers made with these substances. An n+ type substrate 11 represents a source region of a driver SIT. An n− type region 12 represents an epitaxial layer grown on the substrate 11 which serves as a channel region of this SIT, and concurrently serves as a base region of an injector bipolar transistor. Numerals 13-1 and 13-2 represent drains of the SIT, and a p+ type region 14 represents a gate region of the SIT and concurrently serves as a collector region of the injector bipolar transistor (see FIG. 2E). A p+ type region 15 represents an emitter region of the injector bipolar transistor. Numerals 13-1' and 13-2' represent drain electrodes, and 15' represents an emitter electrode. Numeral 14' represents an ohmic electrode of the p+ type region 14 and concurrently forms a Schottky contact between it and the n− type region 12 to provide a Schottky diode. In this case, it is preferable to select the kind of Schottky metal such that the barrier height between the electrode 14' and the n− type region 12 is a little smaller than the diffusion (built-in) potential between the p+ type region 14 and the n− type region 12. Then, the Schottky diode formed with the metal electrode 14' and the n− type region 12 will become conductive before the diode structure formed with the p+ type region 14 and the n− type region 12 becomes conductive.

Typical impurity concentrations of the respective regions are as follows. About $10^{17}$–$10^{21}$ cm$^{-3}$ for the p+ type regions 14 and 15; about $10^{18}$–$10^{21}$ cm$^{-3}$ for the n+ type region 11; about $10^{11}$–$10^{15}$ cm$^{-3}$ for the n− type region 12; and about $10^{18}$–$10^{21}$ cm$^{-3}$ for the n+ type region 13-1 and 13-2. The channel width and the channel impurity concentration of the upside-down type SIT are set so that, at zero gate bias, the channel is sufficiently pinched off by the diffusion (built-in) potential between the gate region and the channel region alone, and also that a high potential barrier is produced within the channel region. The higher impurity concentration of the gate region 14 is, the more desirable, and yet the sharper gradient of the impurity distribution from the gate region toward the channel region is the more desirable, in order to increase the diffusion potential difference between the gate region 14 and the channel region. If this diffusion potential difference is great, a broad range of voltage for allowing operation without causing an excessive injection of minority carriers into the channel region is obtained. To increase this diffusion potential difference, it is also desirable that the impurity concentration of the channel region be relatively high. Also, since the gate region is required only to provide control of the potential of the channel region, it is not necessary that the gate region be great in size; it only need have a minimum necessary size. The smaller the size of the gate region is, the smaller the gate capacitance will become, and thus the amount of unnecessary injection of minority carriers approximately proportional to the area of the gate region will become smaller. As such, in the structure shown in FIG. 2D, it is desirable to construct the gate region in as small a region as possible. The area of the Schottky contact and the material of the Schottky electrode are selected at such value and such material that will allow at least a part of the current supplied from the injector to flow when the potential of the electrode 14' has reached a predetermined value $V_{go}$. In case of silicon, the diffusion potential of the Schottky contact will vary between about 0.6–0.9 V, depending on the type of the metal employed. For example, such metal as Al, Mo, Ta, Cr, Ti and Ni is used to meet the desired purpose.

In order to further decrease the unnecessary injection of minority carriers into the channel region in an integrated circuit having a structure as shown in FIG. 2C, it is only necessary to form that portion of the channel region located in the vicinity of the source region wherein a potential barrier appears as a low (n−) impurity concentration region, and to form that portion of the channel region located close to the drain region so as to have a little higher impurity concentration than this n− type region.

In FIG. 2D, the p+ type regions 14 and 15 are shown to reach the n+ type region (substrate) 11. This arrangement of the p+ type regions is intended to suppress the unnecessary injection of minority carriers from the bottom surface of the p+ type regions to thereby increase the current gain of the injector bipolar transistor and that of the driver SIT. It is needless to say that there may be some distance between the p+ type regions 14 and 15 and the n+ type region 11.

FIGS. 2D and 2E show an instance wherein the integrated circuit is provided with a pnp-type lateral bipolar transistor serving as an injector, and with an n-channel SIT serving as a driver transistor, and also with one input and two outputs.

The structure of the present invention is not limited to those shown. The conductivity types of the respective regions may be reversed. The output terminal is not limited to two, but there may be a number of output terminals as required. Especially, the SIT basically is a voltage-controlled type device, and therefore its drain may be formed in any large number with hardly any degradation of the operation characteristic. If the total size of the gate regions is increased, it is only necessary to increase the current of the injector in an amount corresponding to the increased amount of capacitance resulting from the increased total size of the gate regions, in order to have the circuit perform exactly the same level of operation. In FIG. 2E, there is no need at all for an injection of minority carriers from the external peripheries of the p+ type gate region 14. Injection of minority carriers need only be done into the channel region, i.e. from the p+ type region 14 into the n− type region 12 in FIG. 2D. Therefore, it will be effective to surround the external peripheries of the p+ type gate regions 14 and 15 with an insulating material 26 (see FIG. 2E). It will be effective also to provide a protruding portion in the source region in order to achieve a reduction of the series resistance of the SIT and to thereby increase its transconductance and to reduce the transit time of carriers, and to thereby raise its operating speed. This is stated in detail in U.S. Pat. No. 4,115,793 by one of the inventors of the present application. It should be understood also that the injector is not limited to bipolar transistor, and that it may be constructed with a J-FET or a MOS-FET.

Description has been made above with respect to instances wherein an SIT is employed as a driver transistor. It should be understood also that the present invention may be equally effectively applied to instances wherein a conventional FET or an FET of an improved type is used as a driver transistor.

Figure 3A:
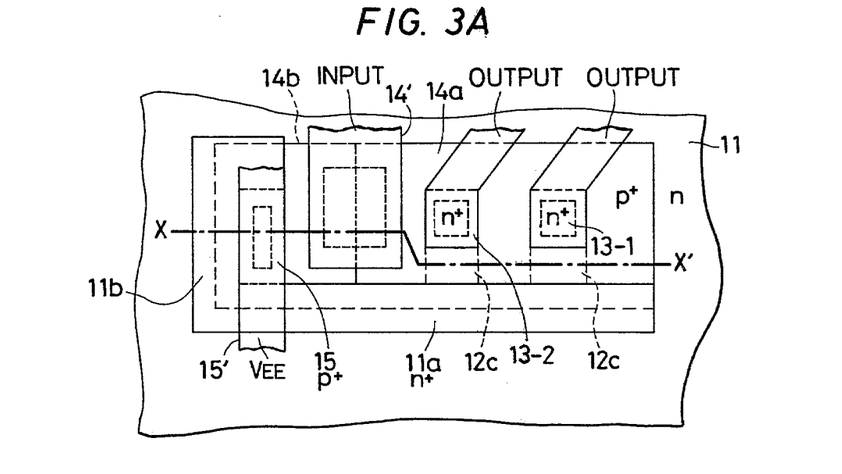
FIGS. 3A and 3B are a plan view and a cross-sectional view of an IIL unit including a bipolar injector transistor and an FET inverter transistor according to another embodiment of the present invention.
Figure 3B:
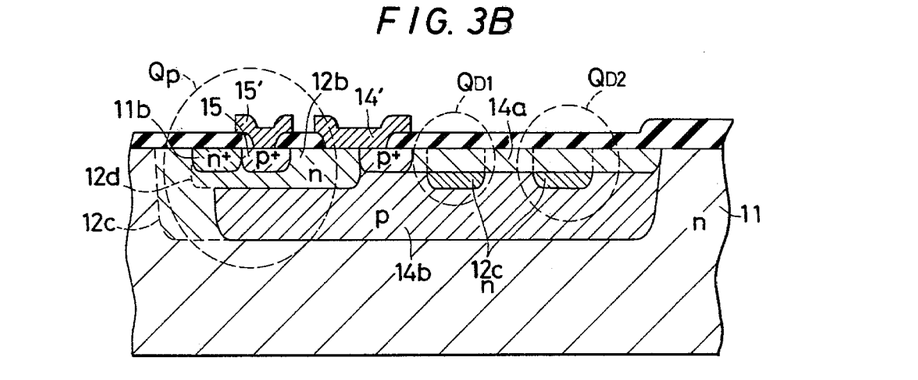

FIGS. 3A and 3B show an embodiment wherein a junction FET is used as a driver transistor according to the present invention. The impurity concentration and the thickness of the channel region 12C are set so that the channel region is being depleted when the gate region 14 and the source region 11a are at a same potential. For example, in case the average impurity concentration of the channel region is $10^{16}$ cm$^{-3}$, the thickness of this channel region may be about 0.3 μm or smaller to satisfy the abovesaid condition. The formation of such thickness and the provision of such impurity concentration are feasible, under good control, by relying on the ion-implantation technique and the double diffusion technique. FIG. 3A shows a diagrammatic plan view of this instant embodiment, and FIG. 3B illustrates diagrammatically a sectional view taken along the line X—X' in FIG. 3A. In these Figures, numeral 11 represents a semiconductor substrate having a first conductivity type, and in this embodiment it is shown as being an n type. Numeral 14b represents a gate region having a second conductivity type opposite to the first type, i.e. a p type in this embodiment. This gate region 14b is common to the two adjacently arranged FET's $Q_{D1}$ and $Q_{D2}$. Furthermore, this region 14b is common also to a collector region of a bipolar transistor $Q_P$.

The region 14a is a high impurity concentration region having said second conductivity type, and this region 14a is provided for the purpose of forming the channel region 12c by relying on the double diffusion technique. This region 14a is provided also for the purposes of providing an ohmic contact of the input terminal of this integrated circuit, and also for avoiding leakage current caused by a surface inversion layer due to the upside-down type construction. Simultaneously with the formation of the high impurity concentration region 14a, the formation of an emitter region 15 of the bipolar transistor $Q_P$ can be carried out. On the other hand, the base region 12b of this bipolar transistor $Q_P$ may be formed by relying on either the ion-implantation technique or the impurity diffusion technique performed from a main surface of the semiconductor body. Accordingly, it is possible to form a built-in electric field in this base region, and in addition thereto it is possible to make the thickness of this base region small. In other words, the lateral injector transistor may comprise a thin base drift transistor. Thus, it is possible to enhance the high frequency characteristic of the bipolar transistor $Q_P$. The provision of such base region 12b will give a useful solution to the otherwise unavoidable limitation to the operation speed of the conventional IIL due to the storage effect of excessive minority carriers and also to the frequency limit of the lateral transistor which has been used as a load transistor in the conventional IIL.

Now, in order to eliminate the excessive charge storage effect in the above-mentioned structures, which being a feature of the present invention, there is provided a Schottky diode by depositing a thin metal film onto the base region of the transistor $Q_P$ so as to extend continuously from the gate region 14a. In such instance, it should be noted that the source regions of the FET's $Q_{D1}$ and $Q_{D2}$ and the base region of the bipolar transistor $Q_P$ are connected together by the continuous extension of a same conductivity type region. Accordingly, this will mean, topologically, that a Schottky diode is connected between the gate regions and the source regions of these FET's. This provision of a Schottky diode is an arrangement useful for the removal of both the saturation of the bipolar transistor $Q_P$ and the excessive charge storage effect occurring at the external peripheral portions of the gate regions of the FET's. In this embodiment, the n type regions 12b and 12c have a higher impurity concentration (e.g. $10^{16}$ cm$^{-3}$) than that (e.g. $10^{13}$ to $10^{15}$ cm$^{-3}$) of the channel region of the SIT of the foregoing embodiment. Therefore, it is relatively easy to form a Schottky barrier lower than the built-in potential between the p+ type region 14a and the n type regions 12b and 12c.

In FIGS. 3A and 3B, numeral 11b represents a high impurity concentration region having said first conductivity type which is provided in order to avoid the unnecessary injection of minority carriers from the emitter region 15 into undesirable regions. The regions 13 is a high impurity concentration region of the junction FET.

In FIGS. 3A and 3B, the base region 12b of the bipolar transistor $Q_P$ and the common source region 11a of the FET's are shown in the form of being continuous with the substrate 11. For example, as shown by the broken lines 12c and 12d in FIG. 3B, the base region 12b of the bipolar transistor $Q_P$ may be formed within the region 14b, and also the common source region 11a of the junction FET's $Q_{D1}$ and $Q_{D2}$ may be formed also within this region 14b. By so arranging, it becomes possible to operate the IC with a reference potential different than the potential of the substrate. Therefore, it becomes possible to provide two circuit systems having different reference potentials within a same semiconductor chip. As a result, it is possible to provide logic columns of several stages having corresponding several different reference potentials by the employment of the currently used 5 V power supply source. Accordingly, it becomes possible to effectively utilize a power supply source. More particularly, a basic circuit containing a bipolar transistor, a Schottky diode and FET's which are comprised of: a semiconductor substrate having a first conductivity type, a gate region having a second conductivity type opposite to said first conductivity type and provided on a surface of said substrate, a channel region having said first conductivity type and provided within said gate region, a drain region having said first conductivity type and provided on the surface of said gate region contiguous with said channel region, a source region having said first conductivity type and provided so as to be contiguous with both said channel region and said gate region, a base region having said first conductivity type and provided at least locally on the surface of said gate region, an emitter region having said second conductivity type and provided on the surface of said base region, and a thin metal film provided continuously on the surface of said base region and also on the surface of said gate region, has a low power dissipation and is free of minority carrier storage. Thus, it is possible to materialize an integrated circuit which is high in the speed of operation, and which has a high voltage utilization efficiency and has a plurality of reference potentials.

Figure 4:
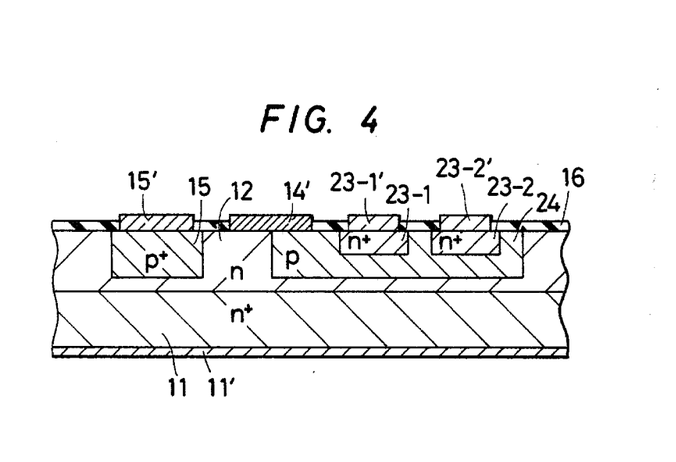
FIG. 4 is a cross-sectional view of a bipolar IIL circuit according to a further embodiment of the present invention.

The present invention is also effective in the usual IIL device comprising a bipolar injector transistor and a bipolar inverter transistor. FIG. 4 shows an improved IIL circuit unit comprising a lateral bipolar transistor and an upside-down type bipolar inverter transistor. A p+ type emitter region 15, an n type base region 12, and a p type collector region 24 constitute a lateral bipolar transistor. An n+ type substrate 11 (and the n type region 11), the p type region 24, and n+ type regions 23-1 and 23-2 constitute an emitter, a base and two collectors of a vertical upside-down type bipolar transistor. An input electrode 14' is formed on both the n type region 12 and the p type region 24 to provide an ohmic contact with the collector/base region 24 and to form a Schottky contact with the n type region 12. In the Figure, numerals 15' and 23-1' and 23-2' represent an injector electrode and collector electrodes. Those holes excessively injected into the p type region 24 can be readily drawn out to the electrode 14' while electrons having potentials above a certain level in the n type region 12 can be injected into the same electrode 14' so as to allow a by-pass current to flow from the p type region 24 to the n type region 12. There will be no excessive injection of minority carriers from the p type region 24 to the n type region 12.

Figure 5:
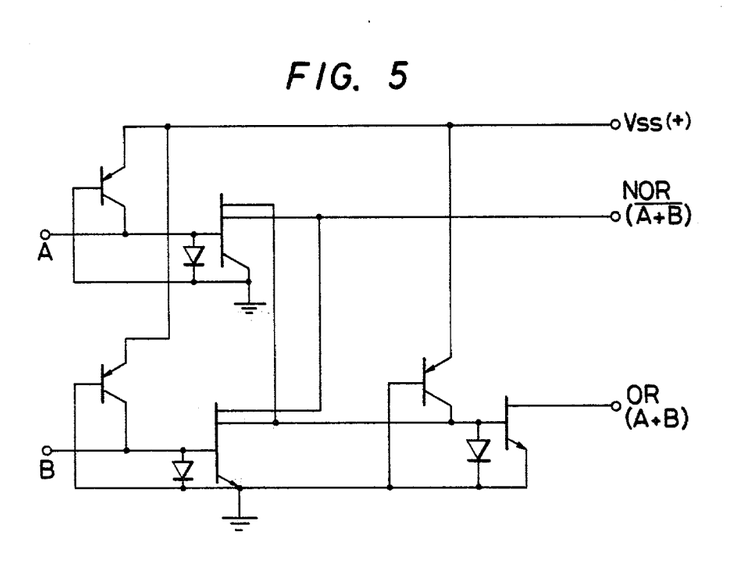
FIG. 5 is a circuit diagram of an example of logic embodying the present invention.

By the employment of the above-said basic circuitry of the present invention, it is possible to form all kinds of logic circuits. FIG. 5 shows an exemplary NOR gate and OR gate integrated circuit using wired logic which represents combination of two basic circuits of one input and two outputs and one basic circuit of one input and one output. Symbols A and B represent input signals, and $V_{ss}$ represents a power supply voltage. As discussed above, the employment of the basic circuitry of the present invention permits the construction of an integrated circuit which is operated at a high speed and at a low power dissipation.

The structure of semiconductor integrated circuit of the present invention may be manufactured by relying on the known crystal growth technique, diffusion technique, ion-implantation technique, fine processing technique, selective diffusion technique, selective etching technique, selective growth technique, selective oxidation technique and like techniques.

The semiconductor integrated circuit according to the present invention, utilizing a Schottky diode is connected between a control electrode region and a grounded electrode region of an inverter transistor, e.g. between the gate region and the source region of the inverter SIT, prevents excessive minority carrier injection into a semiconductor region of low potential, e.g. into the channel region and into the external peripheries of the gate region, and completely eliminates the speed limitation which, in known integrated circuits, has been caused by the storage effect of excessive minority carrier injection into a semiconductor region around the control electrode region, and allows the highspeed and low-power property of the driver transistor to be exhibited just as they are, and materializes a high-speed operation at a very low power dissipation without the accompaniment of lowering the packing density. It will be apparent that various alterations and modifications can be accomplished within the scope of the present invention.

What is claimed is:

1. A semiconductor circuit comprising:
a normally-off unipolar transistor having a single source electrode and a plurality of drain electrodes, and a plurality of current paths formed of semiconductor regions of one conductivity type disposed between said respective drain electrodes and said source electrode and a single gate semiconductor region having electrically connected portions forming pn junctions with a semiconductor region of each of said current paths, and a single gate electrode connected to said gate semiconductor region, said current paths being normally pinched off and becoming conductive upon application of a forward bias to said gate electrode; and
a single Schottky diode connected between said single gate and single source electrodes in such direction that a forward bias to said gate electrode is also a forward bias for the Schottky diode and that the Schottky diode forms a bypass for the gate-source path.

2. A semiconductor circuit according to claim 1, wherein: said transistor has a predetermined threshold voltage for forward conduction between said gate electrode and said source electrode, and said Schottky diode has a threshold voltage for forward conduction not higher than said predetermined threshold voltage.

3. A semiconductor circuit according to claim 1, wherein: said transistor is a static induction transistor.

4. A semiconductor circuit according to claim 1, further comprising:
a reference potential line connected to said source electrode;
an input terminal connected to said gate electrode, and respective output terminals connected to said drain electrodes.

5. A semiconducter circuit according to claim 4, further comprising:
means connected to said gate electrode for supplying a substantially constant current.

6. A semiconductor circuit according to claim 4, further comprising:
another normally-off unipolar transistor having a drain electrode connected to said input terminal and a source electrode connected to said reference potential line.

7. A semiconductor circuit comprising:
a voltage supply line and a reference voltage line which are held at respective substantially constant voltages;
an output terminal;
a transistor having a control electrode connected to said reference voltage line, a first current electrode for supplying charge carriers connected to said voltage supply line and a second current electrode for retrieving said charge carriers connected to said output terminal; and
a Schottky diode connected between said second current electrode and said reference voltage line for forming a bypass between said output terminal and said reference voltage line by forward conduction of the Schottky diode, whereby the transistor supplies to said output terminal, a substantially constant current while the potential thereof is in a predetermined voltage range determined by the Schottky diode and supplying reduced current when the potential thereof exceeds said voltage range by the conduction of said Schottky diode.

8. A monolithic semiconductor integrated circuit device, comprising:
a first semiconductor region of one conductivity type for supplying charge carriers;
a plurality of second semiconductor regions of said one conductivity type for retrieving charge carriers supplied from said first conductivity region;
a plurality of channel semiconductor regions of said one conductivity type disposed between said first and said respective second semiconductor regions to form a path for charge carriers therebetween, each having a predetermined impurity concentration and predetermined dimensions;
a third semiconductor region of a conductivity type opposite to said one conductivity type having a portion disposed adjacent to each said channel semiconductor region to form a pn junction therewith and to establish a depletion layer extending into said channel semiconductor region for controlling said path for charge carriers, thereby controlling travel of charge carriers supplied from said first semiconductor region and retrieved by said second semiconductor regions;
a fourth semiconductor region of said one conductivity type disposed adjacent to said third semiconductor region and electrically connected to said first semiconductor region;
a metal electrode disposed on said third and fourth semiconductor regions and forming a substantially ohmic contact with said third semiconductor region and forming a Schottky contact with said fourth semiconductor region; and
further conductive electrode respectively associated with said first, second and third semiconductor regions forming a carrier supply electrode, a carrier retrieving electrode and a control electrode of a first junction gate unipolar transistor, respectively.

9. A monolithic semiconductor integrated circuit device according to claim 8, further comprising:
a fifth semiconductor region of said opposite conductivity type disposed adjacent to said fourth semiconductor region, said fifth, fourth and third semiconductor regions forming a carrier supply electrode, a carrier transit region, and a carrier retrieving electrode of a second transistor.

10. A monolithic semiconductor integrated circuit device according to claim 9, wherein: said fourth semiconductor region is disposed contiguous to said first semiconductor region.

11. A monolithic semiconductor integrated circuit device according to claim 7, wherein: said device is formed in a semiconductor chip having a first and a second principal surface, and said first semiconductor region extends parallel to and exposed at said first principal surface, said third and fifth semiconductor regions extend from said second principal surface to said first semiconductor region, and said fourth semiconductor region is sandwiched between said third and fifth semiconductor regions and extends from said second principal surface to said first semiconductor region, and said second semiconductor regions are disposed adjacent to said second principal surface and substantially surrounded by said third semiconductor region, and said channel semiconductor region is substantially surrounded by said first, second and third semiconductor regions.

12. A monolithic semiconductor integrated circuit device according to claim 6, wherein: said channel semiconductor region has such impurity concentration and such dimensions that serve to produce depletion layers extending from said third semiconductor region into said channel semiconductor regions and pinching off the carrier paths between said first and second semiconductor regions by said depletion layer when said first and third semiconductor regions are held at substantially equal potentials.

13. A monolithic semiconductor integrated circuit device according to claim 12, wherein: said third semiconductor region has a short length extending along the direction of said carrier paths so that said first transistor exhibits an unsaturating current versus voltage characteristics.

14. A monolithic semiconductor integrated circuit device according to claim 6, wherein: the pn junction formed of said third and fourth semiconductor regions has a predetermined built-in potential, and said Schottky contact has a Schottky barrier not higher than said predetermined built-in potential.

15. A monolithic semiconductor integrated circuit device according to claim 14, wherein: said metal electrode is formed with a metal selected from the group consisting of aluminum, molybdenum, tantalum, chromium, titanium, nickel and their alloys.

16. A monolithic semiconductor integrated circuit device comprising:
a semiconductor substrate of one conductivity type and a low resistivity having a first principal surface;
an expitaxial semiconductor layer of said one conductivity type and a high resistivity formed on said substrate and having a second principal surface;
an emitter semiconductor region of another conductivity type opposite to said one conductivity type formed in said epitaxial layer adjacent to said second principal surface;
a collector semiconductor region of said another conductivity type formed in said epitaxial layer adjacent to said second principal surface so as to sandwich a first portion of said epitaxial layer between said emitter and collector regions and to substantially surround a second portion of said epitaxial layer;
said emitter region, said collector region and said first portion of the epitaxial layer constituting an emitter region, a collector region, and a base region, respectively, of a bipolar transistor;
a plurality of drain semiconductor regions of said one conductivity type and a low resistivity formed in said second portion of the epitaxial layer;
said substrate, said second portion of the epitaxial layer, said collector region and said drain regions constituting a source region, a channel region, a gate region and drain regions, respectively, of a normally-off junction-gate unipolar transistor;
a voltage supply electrode means formed on said emitter region;
an output electrode means formed on said drain region; and
an input metal electrode formed partly on said collector region and partly on said epitaxial layer and making an ohmic contact with said collector region and a Schottky contact with said epitaxial layer.

17. A monolithic semiconductor integrated circuit device according to claim 16, wherein: said emitter and collector regions have a low resistivity and reaching said substrate through said epitaxial layer.

18. A monolithic semiconductor integrated circuit device according to claim 17, further comprising:
an insulator region formed in said epitaxial layer and surrounding the outer peripheries of said emitter and collector regions and said first portion of the epitaxial layer.

19. A monolithic semiconductor integrated circuit device according to claim 16, in which:
said second portion has a plurality of separated regions and said drain region has a plurality of regions so that said substrate, said second portion of the epitaxial layer, said drain region, and said collector region jointly constitute a multidrain unipolar transistor.

20. A monolithic semiconductor integrated circuit device according to claim 16, wherein: said input metal electrode is formed with a metal selected from the group consisting of aluminum, molybdenum, tantalum, chromium, titanium, nickel and their alloys.

21. A semiconductor integrated circuit containing at least a circuit having a bipolar transistor serving as a load transistor and having a junction-gate unipolar transistor serving as a driver transistor and selected from the group consisting of a static induction transistor having a single gate region, single source and a plurality of drain regions, and a field effect transistor having a single gate region, single source region and a plurality of drain regions, and being arranged so that a collector region of said bipolar transistor is in common with gate region of said driver transistor, and that a Schottky diode is connected between the gate region and a source region of said driver transistor to form a bypass for the gate current of the driver transistor.

22. A semiconductor integrated circuit according to claim 21, in which: said Schottky diode is formed with a metal electrode which is provided partly on the gate region of said driver transistor.

23. A semiconductor integrated circuit according to claim 21, containing at least a circuit including a field effect transistor, a bipolar transistor and a Schottky diode which are comprised of a semiconductor wafer having a first conductivity type, a gate region having a second conductivity type opposite to said first conductivity type and provided in a surface portion of said wafer, respective channel regions, having said first conductivity type and provided within said gate region, respective drain regions having said first conductivity type and provided in a surface portion of said gate region and contiguous with said channel regions, a source region having said first conductivity type and provided contiguous with said channel region and with said gate region, a base region having said first conductivity type and provided at least locally in a surface portion of the gate region, an emitter region having said second conductivity type and provided in a surface portion of said base region, and a thin metal film provided continuously on the surface of said base region and also on the surface of said gate region.

* * * * *